(12) United States Patent
Briere et al.

(10) Patent No.: US 7,519,494 B2
(45) Date of Patent: Apr. 14, 2009

(54) INTEGRATED CIRCUIT WITH SIGNATURE COMPUTATION

(75) Inventors: Stéphane Briere, Bourguebus (FR); Jean-Marc Yannou, Colomby sur Thaon (FR); Delphine Rivasseau, Caen (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/569,721

(22) PCT Filed: Aug. 26, 2004

(86) PCT No.: PCT/IB2004/002833

§ 371 (c)(1),
(2), (4) Date: Feb. 24, 2006

(87) PCT Pub. No.: WO2005/022181

PCT Pub. Date: Mar. 10, 2005

(65) Prior Publication Data
US 2007/0032982 A1    Feb. 8, 2007

(30) Foreign Application Priority Data
Sep. 1, 2003   (EP) .................................. 03300105

(51) Int. Cl.
*G01R 31/00*   (2006.01)
(52) U.S. Cl. .................................................. 702/117
(58) Field of Classification Search .................. 702/117
See application file for complete search history.

(56) References Cited

U.S. PATENT DOCUMENTS 5,576,738 A * 11/1996 Anwyl et al. ................ 345/212
5,659,368 A *  8/1997 Landis ......................... 348/467
6,819,327 B2 * 11/2004 Wasserman et al. ......... 345/581

* cited by examiner

*Primary Examiner*—Bryan Bui
*Assistant Examiner*—Jonathan Teixeira Moffat
(74) *Attorney, Agent, or Firm*—Peter Zawilski

(57) ABSTRACT

The present invention relates to an integrated circuit (DEC V) for processing a plurality of data samples (P) of a data signal (I), wherein said integrated circuit is associated with a counter (CT) and comprises means (SIGN M) for computing a signature, said counter (CT) being adapted to trigger and stop a computation of a signature of said data signal (I), said signature being recalculated each time a data sample (P) of said data signal is output by said integrated circuit (DEC V). Use: Video decoder in a set-top-box.

6 Claims, 4 Drawing Sheets

INTEGRATED CIRCUIT WITH SIGNATURE COMPUTATION

FIELD OF THE INVENTION

The present invention relates to an integrated circuit for processing a plurality of data samples of a data signal and to a corresponding test method.

Such integrated circuit may be used in, for example, a computer.

BACKGROUND OF THE INVENTION

An integrated circuit in a computer is used for displaying some data signals such as images on the screen of said computer for example, said data signals comprising data samples that are pixels in this case. An image usually comprises 1280*1024 pixels and a pixel is usually defined by thirty-two bits. This leads to about forty million bits to be transferred onto the screen for an image. To avoid transferring so many data, a solution is proposed and described in the U.S. Pat. No. 5,862,150 referenced "Video Frame Signature Capture".

It consists in using a random access memory digital to analog converter also called RAMDAC that comprises a signature generator, a central processing unit CPU and a digital bus. The computer comprises a frame buffer that contains an image to be displayed on the screen. The RAMDAC permits to compute a signature on the image that is the frame buffer and to compare the result to a "good signature" and this by means of the signature generator, the central processing unit CPU and the digital bus.

One drawback of such solution is that it does not test the images in real time. Indeed, the RAMDAC takes the pixels from the frame buffer, which describes a fixed image to be displayed on the screen of the computer. Thus, when the images displayed on the screen of the computer are images of a video film for example, one does not test the integrated circuit in its functional environment, i.e. the images of a video film as soon as they are displayed on the screen of the computer. Moreover, a central processing unit CPU is needed to compute the signature and this solution is only specific to a RAMDAC. The central processing unit CPU leads to a high consumption and to the use of software.

SUMMARY OF THE INVENTION

Accordingly, it is an object of the invention to provide an integrated circuit for processing a plurality of data samples of a data signal and a corresponding test method, which allow testing data signals in real time without using a central processing unit CPU.

To this end, there is provided an integrated circuit for processing a plurality of data samples of a data signal, wherein said integrated circuit is associated to a counter and comprises means for computing a signature, said counter being adapted to trigger and stop a computation of a signature of said data signal, said signature being recalculated each time a data sample of said data signal is output by said integrated circuit.

In addition, there is provided a method for testing an integrated circuit for processing a plurality of data samples of a data signal, said integrated circuit being associated to a counter, wherein said method comprises the steps of:

inserting said integrated circuit in a data testing system, computing a signature for all the data signals generated by said integrated circuit by means of said counter which is adapted to trigger and stop a computation of a signature of a signal, said signature being recalculated each time a data sample of a data signal is output by said integrated circuit, and comparing in real time said computed signatures with some registered signatures of a referenced integrated circuit each time a signature is computed.

As we will see in detail further on, as the signature is recalculated each time a data sample of a data signal is output by the integrated circuit by means of said counter, it permits to test the integrated circuit in real time and by means of the counter without any central processing unit.

Advantageously, in a non-limited embodiment, the counter is based on an internal clock within the internal circuit and on a vertical synchronization signal of said data signal, said internal clock defining the sequencing of a signature computation and said vertical synchronization signal defining the end of each signature computation.

Preferably, in a non-limited embodiment, the integrated circuit comprises at least a digital to analog converter that comprises said internal clock, the data samples of a data signal being output by said integrated circuit at each clock cycle of said internal clock.

Preferably, in a non-limited embodiment, a data signal comprises an active zone and an inactive zone, which are both taken into account for the signature computation.

Advantageously, in a non-limited embodiment, the integrated circuit further comprises:

an initialization input for outputting a signal defining that said integrated circuit is in a test mode or not, a clock pin for receiving a clock signal of a data testing system, a flag for enabling the reading of a signature by a data testing system, and a serial output for outputting the bits of a signature to said data testing system.

Preferably, in a non-limited embodiment, the integrated circuit further comprises a second output for outputting said vertical synchronization signal to a data testing system.

Advantageously, in a non-limited embodiment, the integrated circuit further comprises activation/deactivation means for defining a time window during which a comparison of a signature computed by said computation means with a referenced signature can be performed.

Preferably, in a non-limited embodiment, the integrated circuit further comprises a delay line for initializing the signature computation block.

BRIEF DESCRIPTION OF THE DRAWINGS

Additional objects, features and advantages of the invention will become apparent upon reading the following detailed description and upon reference to the accompanying drawings in which.

DETAILED DESCRIPTION OF THE INVENTION

In the following description, functions or constructions well known to the person skilled in the art are not described in detail since they would obscure the invention in unnecessary detail.

The present invention relates to an integrated circuit for processing a plurality of data samples of a data signal.

An example in a video application is taken for the further description. Of course, it does not exclude other examples in other applications such as computer.

Figure 1:
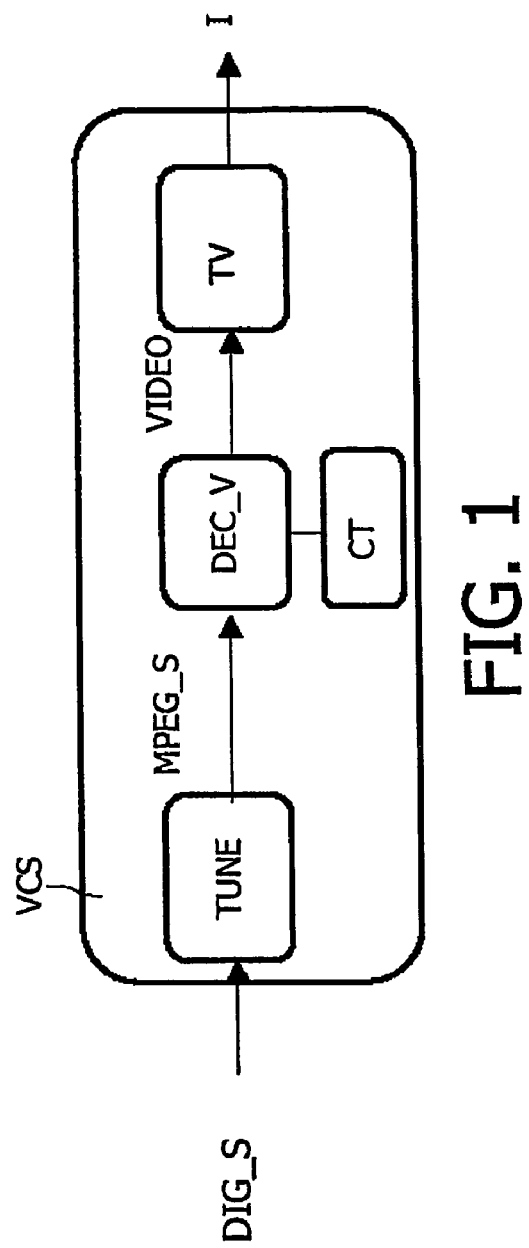
FIG. 1 illustrates an integrated circuit and a counter according to the invention.

Such an integrated circuit can be found in a video processing device VCS, which is described in FIG. 1. Said video processing system VCS comprises a channel satellite decoder DEC_V for decoding said MPEG signal representing a video film VIDEO, said decoder being the integrated circuit and said video film comprising data signals such as images I with data samples such as pixels.

In the application given by way of example, a set-top-box is taken as an example for such a video processing device, the example being not restricted to such a set-top-box or such a decoder.

Generally a set-top-box comprises also a tuner TUNE for receiving a digital signal DIG_S from a parabola, said tuner being adapted to demodulate said digital signal and to output an MPEG signal MPEG_S. Such set-top-box is generally associated with a television TV with a screen on which images I of the video film VIDEO are displayed.

Note that there are two main image formats, a European one called PAL/SECAM and a United States one called NTSC defining 50 images/sec or 60 images/sec, respectively.

Figure 2:
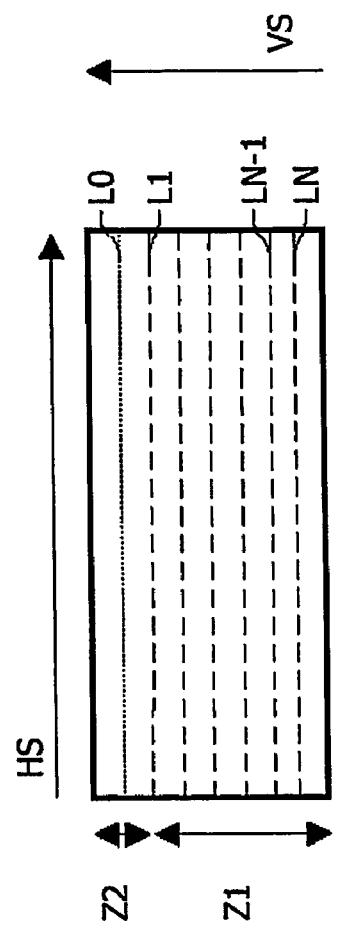
FIG. 2 is a data signal generated by a video processing system to said integrated circuit of FIG. 1, FIG. 3 illustrated in more detail the integrated circuit of FIG. 1.

An image I of a video film is illustrated in FIG. 2. Such an image I comprises a plurality of pixels P. It usually comprises lines L0 to LN of pixels P. A horizontal synchronization signal HS and a vertical synchronization signal VS are used to define the beginning of a line in an image I and the beginning of an image I respectively as well-known to those skilled in the art, one image comprising an active zone Z1 and an inactive zone Z2. The images of a video film and thus the pixels of said images are generated by the channel satellite decoder DEC_V.

Figure 3:
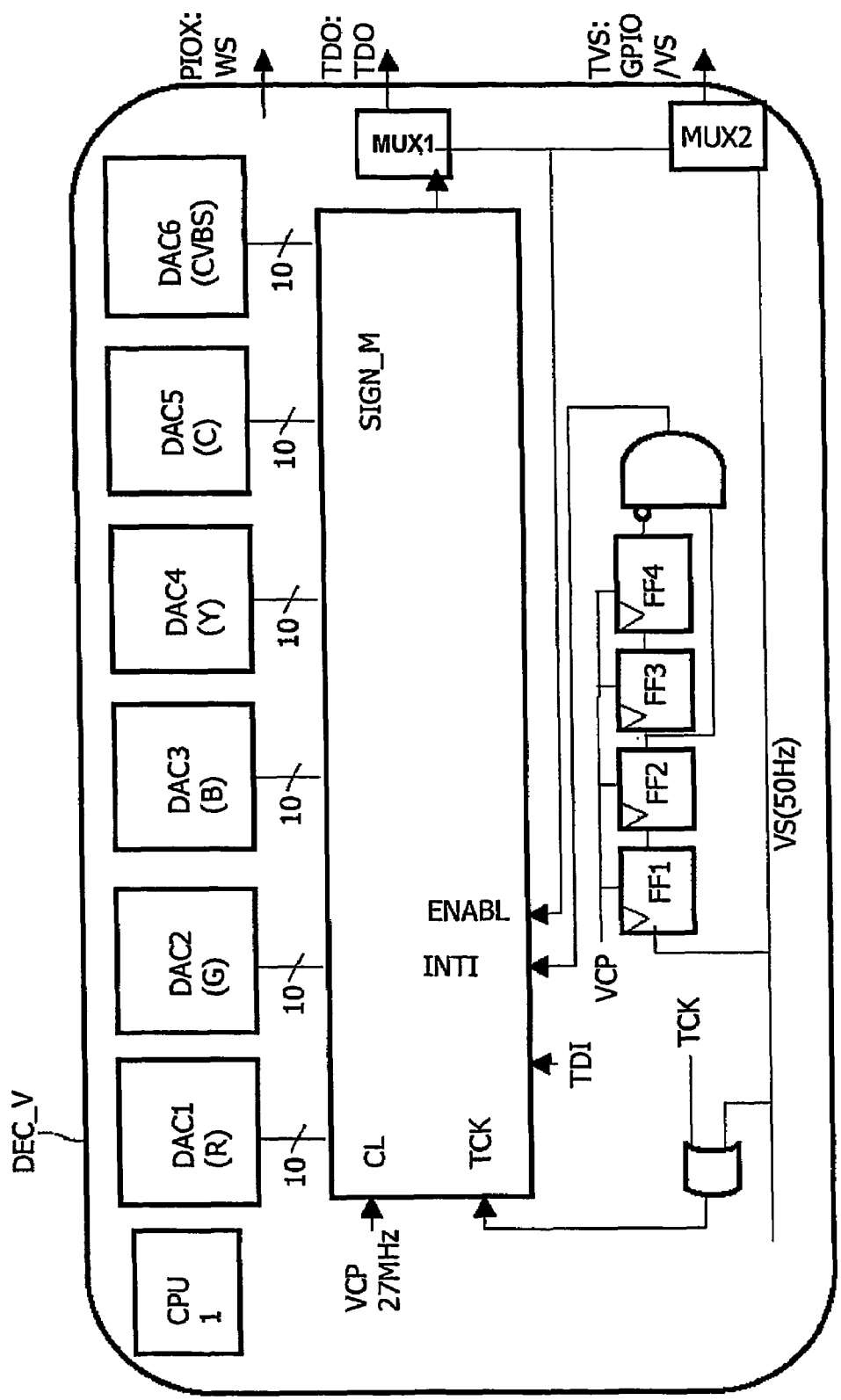

An integrated circuit such as a channel satellite decoder DEC_V is described in FIG. 3. It comprises a central processing unit CPU1 for decoding the input MPEG signal and for generating the images forming said video film. It also comprises 6 digital to analog converters DAC for the R G B, Y C and CVBS video formats, well known to those skilled in the art, each digital to analog converter DAC comprising an internal clock CLK and a data bus.

Regarding the different video formats, the CVBS format corresponds to an image that can be registered on a recorder, whereas the RGB format corresponds to an image that can be displayed on the TV screen and the YC format corresponds to an image for the home video for example.

In order to test the channel satellite decoder DEC_V in its functional environment, a signature of each image of a video film is computed and then compared afterwards to a reference signature of each image. Preferably, the signature is a CRC also called cyclic redundancy checksum well known to those skilled in the art.

The signature of an image I is processed as follows.

When a first pixel of an image I is output by a digital to analog converter DAC, for example the first digital to analog converter DAC1 corresponding to the R format, the computation of the signature of said image I is triggered. The triggering is performed by an associated counter CT. Preferably, in a non-limited embodiment, the integrated circuit DEC_V comprises said counter CT and said counter CT is based on the internal clock CLK1 of said digital to analog converter DAC1 and on the vertical synchronization signal VS of the image I. Said internal clock CLK1 defines the sequencing of a signature computation and said vertical synchronization signal VS defines the beginning and the end of said signature computation.

Note that the vertical synchronization signal VS corresponds to the size of the TV screen, i.e. is of 720*576 lines, and lasts 20 ms for the PAL/SECAM format. At each rising edge of a VS, the signature of the image I is triggered. Then at each clock cycle of the internal clock CLK1, the signature is recalculated, a pixel being output at each clock cycle of the digital to analog converter DAC1. Note that a pixel is a digital value corresponding to an analog signal that is output by a digital to analog converter DAC. Practically, in the example taken, it means that the signature is recalculated each time a pixel of said image I is displayed on the TV screen.

Then at the end of the 20 ms, the signature of said image I is stopped.

When another signal VS arrives, that is to say, another image I is to be processed by the digital to analog converter DAC1, the signature of this second image is computed. And so on for all the images I of a video film VIDEO.

Note that this signature computation is performed in parallel for all the 6 digital to analog converters DAC, and that preferably 10 bits are allocated for each signature corresponding to a digital to analog converter DAC resulting in 60 bits for the whole signatures. Hence, these 60 bits will be used to know if the decoder DEC_V is in order or faulty as described below, instead of the whole image I of usually 1 Mbytes.

The signature computation as described before is used to test the channel satellite decoder DEC_V in its functional environment as follows.

There is a data testing system also called testing board AFTE on which an integrated circuit such as the decoder to be tested is placed. The testing board comprises a central processing unit CPU2 and a clock CLK2 (not represented) that runs at 10 MHz.

In order to test an integrated circuit, the following steps are performed.

But before the testing, a learning step is performed as follows. A reference integrated circuit DEC_RF also called golden device is inserted in the testing board AFTE, signatures for all the images of the video film generated by said integrated circuit DEC_RF are computed and registered in a memory, preferably a read only memory ROM associated with said testing board AFTE. The integrated circuit DEC_V is put in a test mode by the testing board via a controller of said testing board.

Then the testing is performed. The integrated circuit DEC_V to be tested is inserted in the testing board AFTE and signatures for all the images of the video film generated by said integrated circuit by means of said counter CT are computed. Note that for the purpose of the testing, the MPEG signal MPEG_S usually generated by the set-top-box is generated here by the testing board AFTE itself.

To this end, as illustrated in FIG. 3, the integrated circuit DEC_V further comprises:

a signature computation block SIGN_M comprising flips flops and memory to store the signatures (flips flops and memory not represented), an initialization input ENABL adapted to output a signal defining that the integrated circuit is in a testing mode or not, and which is connected to the signature computation block SIGN_M, a first clock pin CL adapted to receive a signal of a sample clock VCP that defines the frequency of the pixels of an image I, a second clock pin TCK adapted to receive a signal of a clock CLK2 of the testing board AFTE, which is connected to said testing board, a flag TDI, which is a pin connected to the signature computation block SIGN_M and to the testing board, adapted to enable the reading of a signature by said testing board, a serial output TDO adapted to output the bits of a signature to the testing board AFTE, said serial output using a first multiplexer MUX1 and being connected to the testing board, a second output TVS adapted to output the vertical synchronization signal VS to the testing board AFTE, said second output using a second multiplexer MUX2 and being connected to the testing board, a delay line comprising four registers also called flip flops FF1 to FF4 and a logic AND gate, said flip flops being connected to the second clock input TCK and to the signature computation block SIGN_M and running at the frequency of the sample clock VCP, and an initialization pin INIT adapted to receive a signal coming from the delay line.

Note that the integrated circuit DEC_V comprises a bus JTAG that is described in a standard referenced IEEE 1149.1. This bus comprises the three pins TDI, TDO and TCK.

Hence, in order to test the integrated circuit DEC_V, one uses some standard pins. It avoids adding more pins to such an integrated circuit DEC_V.

Note that in the example of video taken, the sample frequency VCP of the pixels of an image I is 27 MHz for the standard CCIR 6.5.6 of video transmission for example.

Note that the four pins the TCK, TDI, TDO, TVS used already exist on usual integrated circuit. Only their functionality is changed according to the test mode. Indeed, for example, in the usual mode that is to say when the integrated circuit is in its functional environment, the TVS pin outputs another signal GPIO known as general purpose IO instead of the VS signal, and the serial output TDO outputs a usual test data output signal.

Hence, no extra pins are added for the testing of an integrated circuit such as a decoder. Note that the function of the multiplexers MUX1 and MUX2 is to output the right signal on the corresponding pins TDO, TVS depending on the test mode or usually on the integrated circuit.

When the decoder DEC_V begins to generate a first image I, the signature computation and the comparison in real time can begin. These computations and comparisons last during a time window that is controlled by the decoder DEC_V itself. In order to activate the comparisons window, the decoder DEC_V sends a first window signal WS to the testing board AFTE via an interrupt pin PIOX. Then, when the last image I is generated, the decoder DEC_V sends a second window signal to deactivate the comparisons window. The time called comparison time window between the first window signal WS and the second one can last 10 sec for example.

During such a comparisons window, when a signature has been computed as described above for an image I, that is to say each 20 ms, the integrated circuit DEC_V outputs a vertical synchronization signal VS associated with the image I processed on the second output TVS. This vertical synchronization signal VS is on its rising edge as illustrated in the FIG. 4. At each rising edge, the computed signatures are stored in the flips flops by the signature computation block SIGN_M and two clock cycles of TCK later, the flip flops of the signature computation block SIGN_M are reinitialized. Preferably, 60 flip flops are used to store the 60 bits of the 6 computed signatures corresponding to the 6 digital to analog converters DAC. Hence, the 6 CRC are computed in parallel.

Note that the delay of the 2 clock cycles TCK is obtained by means of the delay line with the four flip-flops FF1 to FF4. Thus, the delay line permits to initialize the signature computation block SIGN_M correctly, i.e. the computation signatures.

Then the testing board AFTE enables the reading of the computed signature by means of the flag TDI. This flag is set to 1. Note that this enabling is performed whenever wanted by the testing board, within 20 ms, i.e. within two rising edges of the vertical synchronization signal VS.

When the flag TDI is enabled, the testing board AFTE sends 60 clock cycles on the second clock pin TCK to read the computed signatures corresponding to the 6 digital to analog converters DAC on the serial output TDO, 10 bits being used for one signature. At the serial output, the testing board AFTE catches the 60 bits of the signatures.

Figure 4:
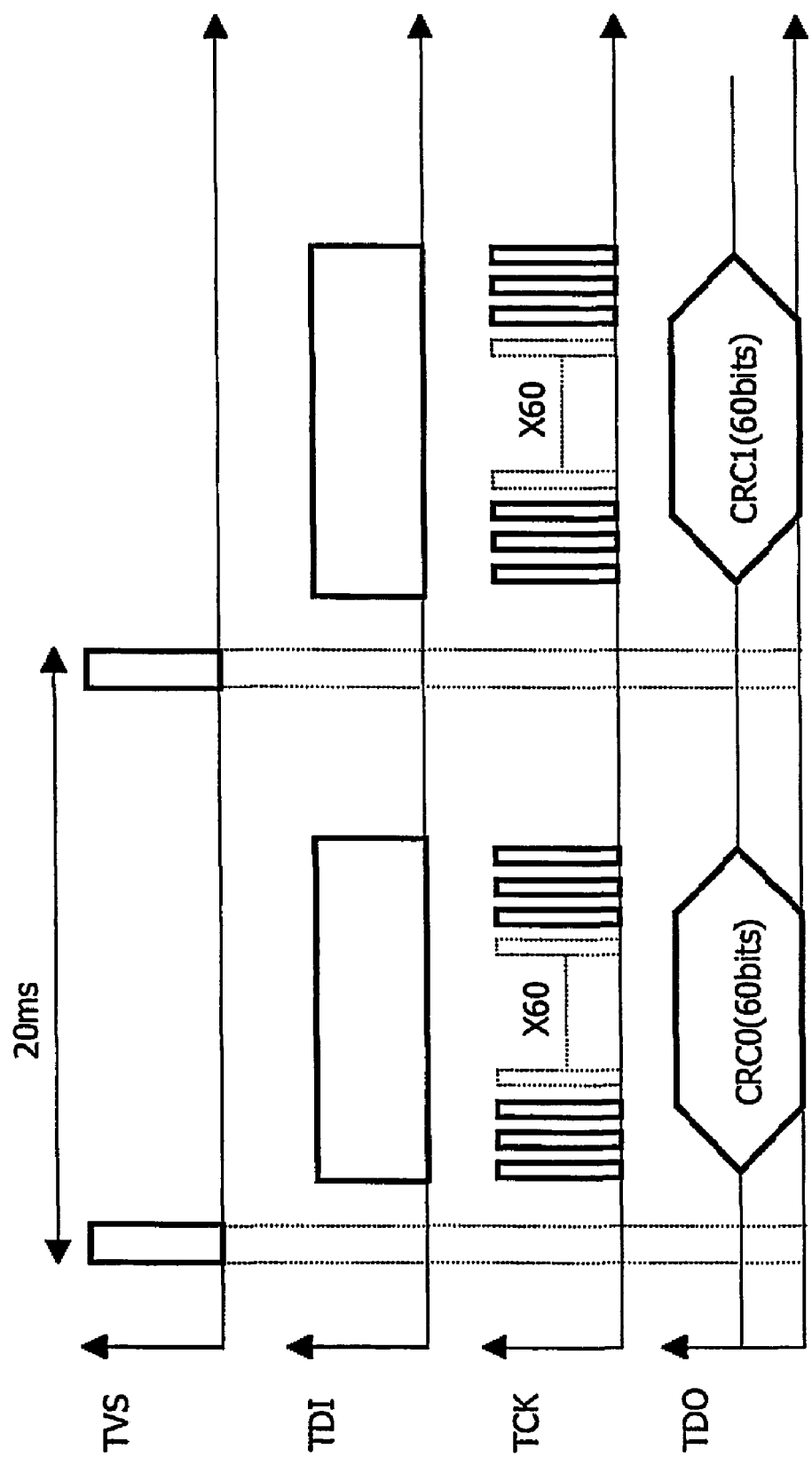
FIG. 4 is a diagram showing a scheduling of a signature computation by means of the counter of FIG. 1.

Note that in the example of the FIG. 4, the CRC0 represents the 6 CRC concatenated corresponding to the 6 digital to analog converters DAC of a first image I0. The CRC1 represents the 6 CRC concatenated corresponding to the 6 is digital to analog converters DAC of a second image I1.

Figure 5:
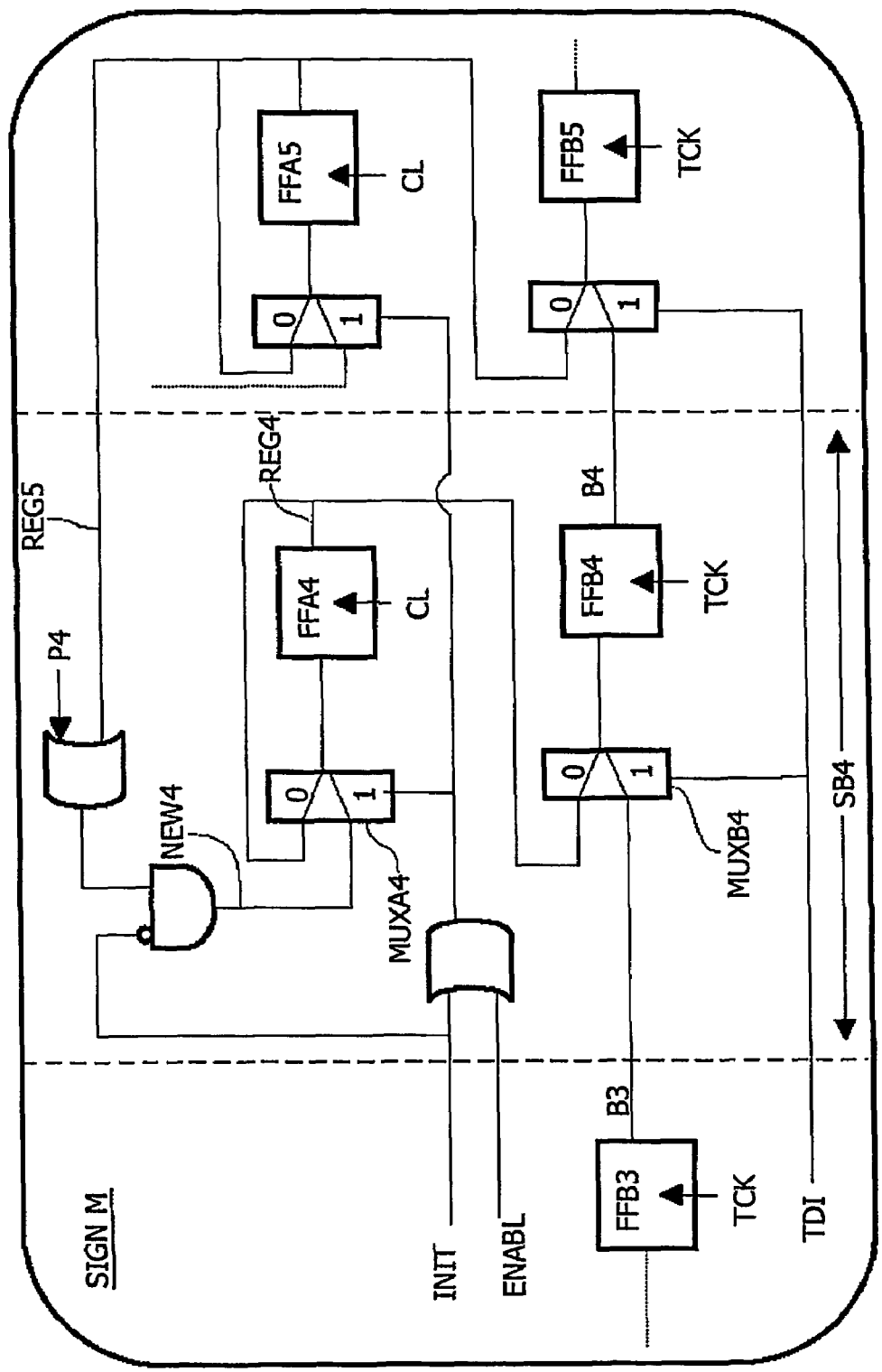
FIG. 5 illustrates a schematic diagram of signature computation means within the integrated circuit of FIG. 3.

The signature computation block SIGN_M is described in the FIG. 5. In this non-limited embodiment, in order to compute a signature of 60 bits, said computation block SIGN_M comprises:

a first set of 60 flip-flops FFAi, numbered 0 to 59 (i=0, . . . 59), associated with 60 XOR-gates and 60 AND-gates, a first multiplexer MUXAi (i=0, . . . 59) being associated with each first flip flop FFAi, a second set of 60 flip-flops FFBi, numbered 0 to 59 (i=0, . . . 59), a second multiplexer MUXBi (i=0, . . . 59) being associated with each second flip flop FFBi.

Each flip flop FFAi of the first set is clocked by sample clock VCP via the first clock pin CL, whereas each flip flop FFBi of the second set is clocked by clock CLK2 of the testing board AFTE via the second pin clock TCK.

As shown in the FIG. 5, the computation block SIGN_M is divided in 60 sub-blocks SBLi, i=0, . . . , 59, each sub-block comprising:

a first flip flop FFAi with its associated XOR-gate, AND-gate, and first multiplexer MUXAi, and a second flip-flop FFBi with associated second multiplexer MUXBi.

At a time t, a sub-block computes a result value NEWi that is the result of a XOR between a data sample Pi and a register value REGi+1 of the next sub-block SBi+1 that has been computed the preceding time t−1 and stored in the first flip flop FFAi+1 of the next sub-block SBi+1. Hence, NEWi(t)=Pi(t) XOR REGi+1(t) [1].

The sub-block SB4 is taken in the example of the FIG. 5. In practice, a result value is processed as follows.

When the initialization pin INIT is reset, the flag TDI being set to 0, the computation can begin according to the formula [1] described above for each sub-block SBi. At each sample clock cycle VCP on the clock pin CL, a new pixel Pi is input in the XOR gate of the corresponding sub-block SBi. Thus, the result value NEWi(t) changes at each clock cycle VCP. Then, at each rising edge of the sample clock VCP, the result value NEWi(t) is stored in the first flip-flop FFAi and will be used within the preceding sub-block Sbi−1 for the next time t+1 as a register value REGi. Note that when the initialization pin is set to one, the result values NEWi are null.

It is to be noted that the last sub-block SB59 does not have any register value REG59, and that its result value NEW59 is different from the other result values NEWi. Thus, REGi(t)=NEWi(t−1)=Pi(t−1) XOR REGi+1(t−1), i=0 to 58 and REG59(t)=P59(t−1) XOR REG0(t−1) XOR REG57(t−1).

When all the result values NEWi(t) have been computed and stored in the corresponding first flip-flops FFAi, it means that the signature computation of an image I is over. The end of an image I computation is defined by the vertical synchronization signal VS as described before.

Then, as described before, the testing board AFTE sets the flag TDI to one and the clock cycles of clock CLK2 begin. At the first clock cycle, the register values REGi of each sub-block SBi are stored in the second flip flops SBi via the second multiplexers MUXBi control, resulting in a store value Bi. Then at the following clock cycle, the last value B59 stored is output on the serial output TDO. Then the next clock cycle, the previous value B58 stored is output on the serial output TDO and so forth until all the register values Bi are output. The signature is thus output on the serial output TDO. Thus, it is to be noted that one has 61 clock cycles on the clock pin TCK, the first one coming from the vertical synchronization signal VS and the 60 following clock cycles coming from the testing board AFTE, i.e. from the clock CLK2, as shown on FIG. 3.

Note that when the third clock cycle (i.e. just after the re-initialization by the delay line) on the pin TCK is produced, the computation of another signature can begin without having values of the preceding signature being lost because these values have been saved in the second flip flops FFBi. Thus, the first flip flops FFAi can be initialized via the initialization pin INIT, which is set to 1 by means of the delay line 2 clock cycles after VS is asserted. Two flip-flops are used for the initialization of the initialization pin INIT and the other two for the reset.

It is to be noted that there is a comparison of said second computed signatures with the registered signatures each time a signature is computed as described above. The reference signatures are read by the testing board AFTE via its universal serial bus USB or universal asynchronous receiver transmitter UART port.

Then the central processing unit CPU2 of the testing board AFTE manages the results of the comparisons, calculates the rate of return and the rate of failures. Preferably, in order to have some good statistics on these rates, one stores which signatures of which formats are faulty and the number of time they are faulty.

Note that for the testing board AFTE, no extra pins are added to test the decoder DEC_V. A testing board AFTE has usually four pins associated to the four pins TCK, TDO, TDI of the decoder DEC_V.

Note also that the referenced signatures are stored in the read only memory ROM of a testing board AFTE, either directly from the referenced circuit DEC_RF or from an external PC where the referenced signatures can have been stored. This last solution permits to run a plurality of testing board AFTE and to avoid inserting each time the referenced circuit in a testing board.

Thus, according to the invention, as the signatures for the images are computed as when the decoder DEC_V is running in its functional environment, that is to say when a video film is being generated by said decoder DEC_V said decoder is tested in real time.

Thus, the decoder is tested within its functional environment as if it is running in a customer's environment, such customer being an integrator that sells consumer equipment such as a set-top-box to a broadcaster for example. The set-top-box is in this case the video processing device and comprises the decoder, a tuner and a LCD screen for example. Thus, it avoids having too many faulty integrated circuits returned by a customer. The functional testing that tests the functions (the decoding function in the example taken) of an integrated circuit is better in terms of quality for a customer than the structural testing that only tests the logic of each component of said integrated circuit. Hence, the customer knows if his whole consumer equipment does not work. Indeed, if its tuner does not work for example, the error will affect the decoder, which will output a false signature.

Another advantage is that according to the invention, the solution proposed is not only dedicated to a specific architecture such as a RAMDAC but can be applied on other architecture of integrated circuits.

Furthermore, as the decoder is tested as in its functional environment, it permits to use the usual memory for the decoding application that is within the decoder in its usual data bus frequency of 166 MHz or 133 MHz, which is impossible for automated test equipment ATE described in some other prior art because such ATE can bear such fast frequencies as well known by those skilled in the art. Indeed, if the data bus frequency is too high, it leads to too many noise on said bus that disrupt the ATE.

Note that the usual memory of a decoder is generally a synchronous dynamic random access memory SDRAM for storing data such as data samples for example.

Another advantage is that the testing board for testing the decoder is the master of the signatures computation. It is totally asynchronous to the decoder. Indeed, the testing board begins the signature computation when ever it wants within the reception of two images (within 20 ms for the European format 50 Hz, i.e. within the comparison time window) whereas in the prior art described before the signature computation depends on the frame buffer i.e. random access memory RAM refreshing the integrated circuit itself and also upon ithe computation speed of its central processing unit CPU. Indeed, in the prior art an image is stored in the frame buffer, the central processing unit CPU of the integrated circuit has to be very fast to compute a signature of an image before another image is stored in the frame buffer and erase the image being processed. If the central processing unit CPU is too slow, the signature will be faulty, as it will take some data samples of the next image also. In some cases, one can find in the prior art a double frame buffer to solve this problem, but this double frame buffer takes a lot of room on the silicon of the integrated circuit.

A fifth advantage of the integrated circuit according to the invention is that the signatures are computed by means of computing means that use only flip flops. No central processing unit is needed, the consumption of the decoder is thus decreased in terms of energy. No RAM is used. It avoids using too much room on the silicon of the decoder.

A sixth advantage is that no extra pins are added to implement the invention either on the decoder or on the testing board itself. Hence the invention can be simply implemented on an integrated circuit and testing board that already exist.

A seventh advantage is that the testing method according to the invention does not use two integrated circuits in parallel on the testing board as can be seen in some other prior art. It avoids having a problem of finding room on the testing board, said testing board being usually standardized and having usually not too much room. It avoids also the problem of synchronizing said two integrated circuits on the testing board.

An eighth advantage is that the use of signatures instead of the images themselves to test the decoder permits to reduce the memory used for the testing. Indeed, instead of having a memory or registers of some Megabytes (an image taking about 1 Mbyte), one has a memory or registers of a few bits.

Finally, as all the pixels of an image are taken into account in the signature computation, the inactive zone within said image is also tested. Said inactive zone corresponds to the characters usually called "teletext" that appear above a visual image seen by the user of a TV for example.

It is to be understood that the present invention is not limited to the aforementioned embodiments and variations and modifications may be made without departing from the spirit and scope of the invention as defined in the appended claims. In this respect, the following closing remarks are made.

It is to be understood that the present invention is not limited to the aforementioned video application. It can be used in a video encoder for example.

It can be used within any application using a system with a digital circuit. For example it can be used for an integrated circuit used for MPEG compression. In this MPEG application, the counter CT is based on a synchronization pin, a clock pin and a validation pin for triggering/stopping the beginning of a reading of the signature, for sequencing the reading of the bits of a signature and for validating a compression of an image I respectively. In this case, the signature comprises 188 or 204 bytes. The counter CT can be external or internal to the integrated circuit.

Another example can be an integrated circuit for audio application. In this case, a data signal is usually called a frame.

It is to be understood that the method according to the present invention is not limited to the aforementioned implementation.

There are numerous ways of implementing functions of the method according to the invention by means of items of hardware, provided that a single item of hardware can carry out several functions. It does not exclude that an assembly of items of hardware carry out a function, thus forming a single function without modifying the method of testing an integrated circuit in accordance with the invention. Said hardware items can be implemented in several manners, such as by means of wired electronic circuits.

Any reference sign in the following claims should not be construed as limiting the claim. It will be obvious that the use of the verb "to comprise" and its conjugations does not exclude the presence of any other steps or elements besides those defined in any claim. The article "a" or "an" preceding an element or step does not exclude the presence of a plurality of such elements or steps.

The invention claimed is:

1. An integrated circuit, for processing a plurality of data samples of a data signal, wherein said integrated circuit is associated with a counter, the integrated circuit comprising: data processing circuitry to compute a signature, said counter for stopping the data processing circuitry to trigger recalculating a signature of said data signal, said signature to be recalculated each time a data sample of said data signal is output by said integrated circuit, wherein a data signal comprises an active zone and an inactive zone, which are both taken into account for the signature computation.

2. An integrted circuit for processing a plurality of data samples of a data signal, wherein said integrated circuit is associated with a counter, the integrated circuit comprising: data processing circuitry to compute a signature, said counter for stopping the data processing circuitry to trigger recalculating a signature of said data signal, said signature to be recalculated each time a data sample of said data signal is output by said integrated circuit; and an initialization input for outputting a signal defining that said integrated circuit is in a test mode or not, a clock pin for receiving a clock signal of a data testing system, a flag for enabling the reading of a signature by a data testing system, and a serial output for outputting the bits of a signature to said data testing system.

3. An integrated circuit for processing a plurality of data samples of a data signal, wherein said integrated circuit is associated with a counter, the integrated circuit comprising: data processing circuitry to compute a signature, said counter for stopping the data processing circuitry to trigger recalculating a signature of said data signal, said signature to be recalculated each time a data sample of said data signal is output by said integrated circuit; and a delay line for initializing the signature computation block.

4. An integrated circuit, for processing a plurality of data samples of a data signal, wherein said integrated circuit is associated with a counter, the integrated circuit comprising: data processing circuitry to compute a signature, said counter for stopping the data processing circuitry to trigger recalculating a signature of said data signal, said signature to be recalculated each time a data sample of said data signal is output by said integrated circuit, wherein in real time and synchronous with arrival of a new data sample, the counter stops the data processing circuitry to trigger recalculating a signature.

5. A method of testing an integrated circuit for processing a plurality of data samples of a data signal, said integrated circuit being associated to a counter, wherein said method comprises the steps of: inserting said integrated circuit in a data resting system, computing a signature for all the data singals generated by said integrated circuit using said counter to trigger and stop a computation of a signature of a signal, said signature being recalculated each time a data sample of a data signal is output by said integrted circuit, and comparing in real time said computed signatures with some registered signatures of a referenced integrated circuit each time a signature is computed, a result of the comparison being used to determine whether of not said integrated circuit is faulty, wherein computing a signature is performed without use of a CPU amd without use of a buffer to store the data samples.

6. A method of testing an integrated circuit for processing a plurality of data samples of a data signal, said integrated circuit being associated to a counter, wherein said method comprises the steps of: inserting said integrated circuit in a data testing system, computing a signature for all the data signals generated by said integrated circuit using said counter to trigger and stop a computation of a signature of a signal, said signature being recalculated each time a data sample of a data signal is output by said integrated circuit, and comparing in real time said computed signatures with some registered signatures of a referenced integrated circuit each time a signature is computed, a result of the comparison being used to determine whether or not said integrated circuit is faulty, wherein computing a signature is performed using flip flops.

* * * * *